United States Patent
Shimizu et al.

(10) Patent No.: US 7,847,995 B2
(45) Date of Patent: Dec. 7, 2010

(54) MEMS DEVICE AND OPTICAL SWITCH

(75) Inventors: Takashi Shimizu, Kawasaki (JP); Kazuyuki Mori, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/500,665

(22) Filed: Jul. 10, 2009

(65) Prior Publication Data

US 2010/0134860 A1 Jun. 3, 2010

Related U.S. Application Data

(63) Continuation of application No. PCT/JP2007/052977, filed on Feb. 19, 2007.

(51) Int. Cl.
G02B 26/08 (2006.01)
G02B 26/00 (2006.01)
G02B 6/26 (2006.01)

(52) U.S. Cl. ............ 359/224.1; 359/290; 359/291; 359/295; 385/17; 385/18

(58) Field of Classification Search ........... 359/221.2, 359/223.1, 224.1, 290, 291, 295; 385/16, 385/17, 18; 257/415, E29.324
See application file for complete search history.

(56) References Cited

U.S. PATENT DOCUMENTS 7,277,606 B1 * 10/2007 Sakai et al. ............... 385/18

7,439,547 B2 * 10/2008 Kitagawa et al. ............. 257/80

FOREIGN PATENT DOCUMENTS

| JP | 8-179590 | 7/1996 |
|----|----------|--------|
| JP | 2003-246070 | 9/2003 |
| JP | 2004-70053 | 3/2004 |
| JP | 2004-070053 A | 3/2004 |
| JP | 2006-162699 | 6/2006 |

OTHER PUBLICATIONS

Search Report and Written Opinion, mailed May 15, 2007, in corresponding PCT Application No. PCT/JP2007/052977 (7 pp., including translation of Search Report).
Written Opinion of the International Searching Authority, Form PCT/ISA/237, mailed May 22, 2007, in corresponding International Application No. PCT/JP2007/052977.
Notification Concerning Transmittal of International Preliminary Report on Patentability, Form PCT/IB/326, mailed Aug. 27, 2009, in corresponding International Application No. PCT/JP2007/052977.
Notification of Transmittal of Translation of the International Preliminary Report on Patentability, Form PCT/IB/338, mailed Aug. 27, 2009, in corresponding International Application No. PCT/JP2007/052977.
International Preliminary Report on Patentability, Form PCT/IB/373, issued Aug. 19, 2009, in corresponding International Application No. PCT/JP2007/052977.

* cited by examiner

*Primary Examiner*—Jack Dinh
(74) *Attorney, Agent, or Firm*—Staas & Halsey LLP

(57) ABSTRACT

A micro electro mechanical system device includes a fixed electrode that includes a first electrode group, and a movable electrode that moves with respect to the fixed electrode as voltage is applied and includes a second electrode group that opposes the first electrode group, wherein electrodes of at least one among the first electrode group and the second electrode group are connected via a resistor.

13 Claims, 11 Drawing Sheets

| RESISTOR [Ω] | VOLTAGE DROP [%] | ANGLE VARIATION [°] | RC TIME CONSTANT |
|---|---|---|---|
| CONVENTIONAL (1Ω) | 100 | 2.55 | 0.1psec |
| 1kΩ | 45.3 | 1.04 | 100psec |
| 10kΩ | 7.7 | 0.19 | 1nsec |

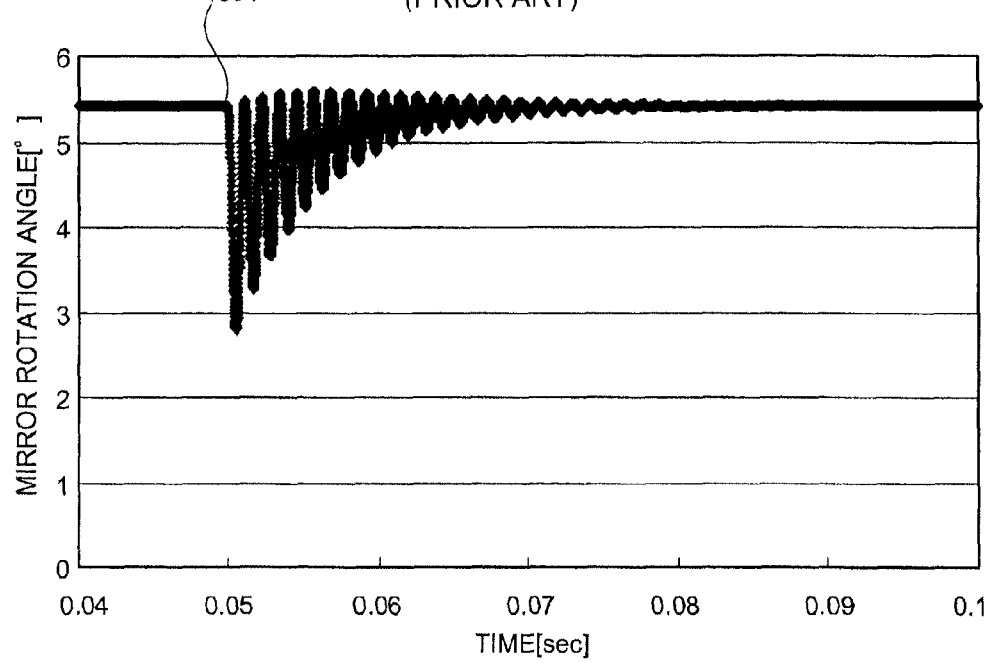

MEMS DEVICE AND OPTICAL SWITCH

This application is a continuation of International Application No. PCT/JP2007/052977, filed Feb. 19, 2007, the disclosure of which is incorporated herein in its entirety by reference.

FIELD

The embodiments discussed herein are related to a MEMS device and an optical switch.

BACKGROUND

A micro electro mechanical system (MEMS) device is made up of small parts created by fine processing technology for semiconductors. An optical switch that switches optical paths in an optical communication system uses a MEMS device (see, for example, Japanese Laid-Open Patent Application Publication No. 2004-70053).

The MEMS device applies high voltage to electrodes to gather electrical charge at each electrode and yields a mechanical displacement by electrostatic force. Since the extent of the mechanical displacement can be adjusted by the voltage applied, the MEMS device is used for many purposes in addition to optical switches.

FIG. 15 is a perspective view of electrodes of a conventional MEMS device. As depicted in FIG. 15, the MEMS device includes a fixed electrode 1510 and a movable electrode 1520. On the fixed electrode 1510 and the movable electrode 1520, electrodes 1511-1514 and 1521-1524 are arranged in a comb-like configuration.

When voltage is applied to the fixed electrode 1510 and the movable electrode 1520, the electrodes 1511-1514 take positive charge and the electrodes 1521-1524 take negative charge. In this way, electrostatic force works between the electrodes 1511-1514 and the electrodes 1521-1524, whereby the movable electrode 1520 moves in the direction indicated by an arrow 1530 with respect to the fixed electrode 1510.

When the MEMS device is applied to an optical switch, a mirror is fixed to the movable electrode 1520. Voltage is applied to the fixed electrode 1510 and the movable electrode 1520 to displace the movable electrode 1520 and change the angle at which the mirror reflects light. As a result, the optical path is switched by controlling the voltage for the fixed electrode 1510 and the movable electrode 1520.

However, if the voltage applied is increased in order to increase the amount of displacement of the movable electrode 1520 and improve performance of the MEMS device, occasionally spark discharge occurs between the fixed electrode 1510 and the movable electrode 1520. The spark discharge results in unexpected movement of the movable electrode 1520 or damage to the fixed electrode 1510 and the movable electrode 1520.

FIG. 16 is an explanatory diagram for the principle of spark discharge. As depicted in FIG. 16, increasing the voltage applied between electrodes 1601 and 1602 accelerates an electron 1612 and a gas molecule 1611 colliding with the electron 1612 is ionized. As reference numeral 1620 indicates, a positively charged ion 1621 generated by the ionization collides with the electrode 1602, a negative electrode. A large, instantaneous electric current due to secondary electron emission caused by the collision is called spark discharge.

FIG. 17 is an explanatory diagram illustrating spark discharge occurring in the conventional MEMS device. As indicated by reference numeral 1701, when spark discharge occurs between an electrode 1512 and an electrode 1521, charges on electrodes near the electrodes 1512 and 1521 (or on all electrodes) disappear by recombination.

Thus, electrostatic attractive force displacing the movable electrode 1520 drops instantaneously. An instantaneous drop in electrostatic attractive force causes unexpected behavior of the movable electrode 1520. In particular, when the MEMS device is used as an optical switch in an optical network, the spark discharge causes unfavorable displacement of the movable electrode 1520 and disturbs the optical path, resulting in a communications breakdown on a network.

In addition, once the spark discharge occurs between the electrodes 1512 and 1521, it takes time to supply the electrodes 1512 and 1521 with charges from other electrodes, a power source, or ground, and to reduce a potential difference between the electrodes 1512 and 1521. As a result, the spark discharge occurs for a long time and consequently, it takes time for the movable electrode 1520 to return to an original position. Furthermore, since the spark discharge occurs for a long time, current due to the discharge increases, whereby the displacement of the movable electrode 1520 becomes larger.

FIG. 18 is a circuit diagram that is equivalent to the MEMS device depicted in FIG. 17. The fixed electrode 1510 and the movable electrode 1520 of the MEMS device are equivalent to multiple condensers connected in parallel. As depicted in FIG. 18, the condensers connected in parallel can be thought of as one large condenser 1801.

The spark discharge between the fixed electrode 1510 and the movable electrode 1520 is equivalent to a state where a switch 1802, which is connected to both ends of the condenser 1801, is instantaneously turned on. As the switch 1802 is turned on, charges on the condenser run through the switch 1802 and disappear.

FIG. 19 is a graph depicting the displacement of the mirror of the conventional MEMS device due to spark discharge. In FIG. 19, the horizontal axis is time [sec]. The vertical axis is an angle [°] of rotation of a mirror fixed on the movable electrode 1520. Reference numeral 1901 indicates a point at which the spark discharge occurred. As depicted in FIG. 19, the maximum displacement of the mirror fixed on the movable electrode 1520 occurs when the spark discharge occurs, and the displacement decreases over time.

One way to deal with this problem is to cover the entire surface of the fixed electrode 1510 and the movable electrode 1520 with insulating film, preventing secondary electrons from being generated at the collision of positive ions against electrodes. One example is a vacuum deposition method where coating material is heated to a high temperature and applied to the MEMS device by exposing a surface of the MEMS device to the vapors under vacuum conditions.

However, when the shape of the fixed electrode 1510 and the movable electrode 1520 is complicated as depicted in FIG. 15, it is difficult to coat the electrodes uniformly. In addition, since high voltage is applied to the fixed electrode 1510 and the movable electrode 1520, insulating film coating the electrodes may cause residual polarization; even after the voltage is changed, polarization before the change of voltage remains. In this case, even if the voltage is controlled, actual displacement and planned displacement do not coincide.

SUMMARY

According to an aspect of the invention, a micro electro mechanical system device includes a fixed electrode that includes a first electrode group; and a movable electrode that moves with respect to the fixed electrode as voltage is applied and includes a second electrode group that opposes the first electrode group. Further, electrodes of at least one among the first electrode group and the second electrode group are connected via a resistor.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 19 is a graph depicting the displacement of the mirror of the conventional MEMS device due to spark discharge.

DESCRIPTION OF EMBODIMENTS

Preferred embodiments of the present invention will be explained with reference to the accompanying drawings.

Figure 1:
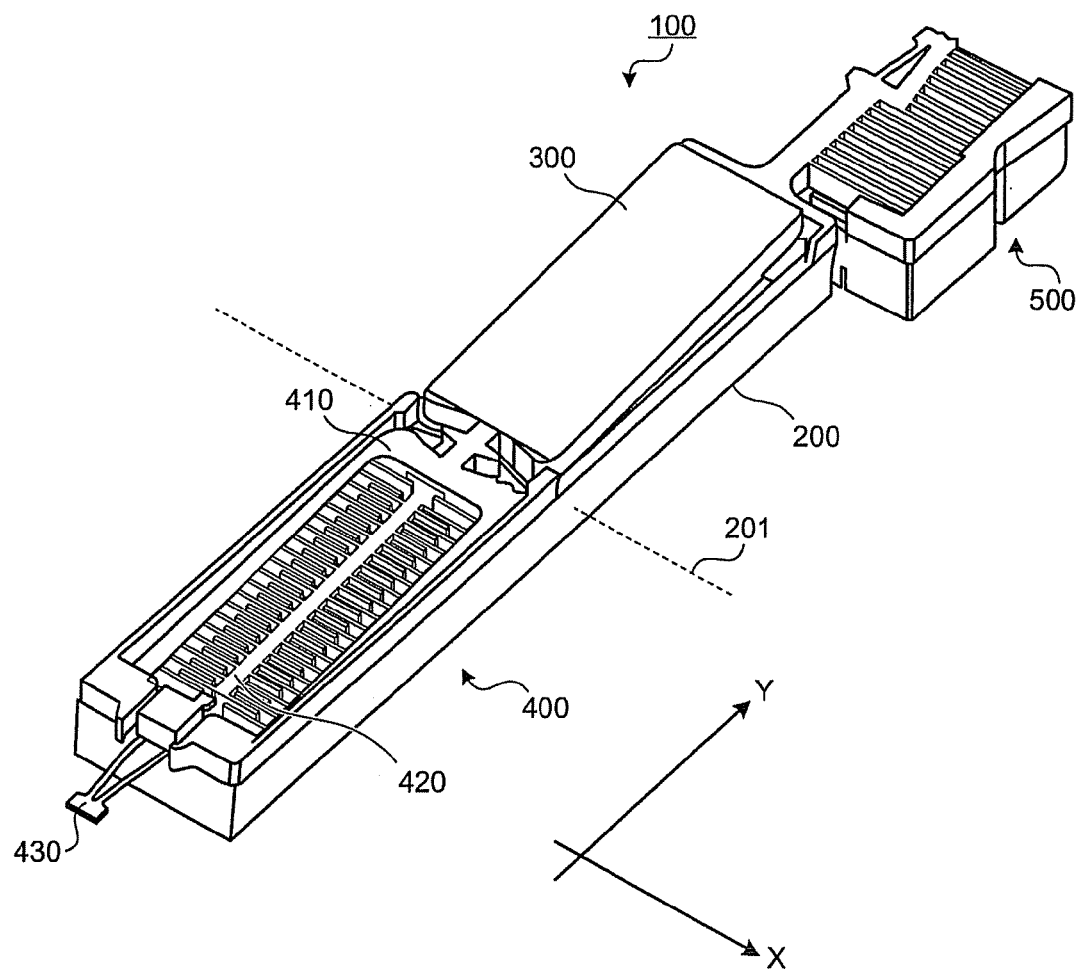
FIG. 1 is a perspective view illustrating a MEMS device according to a first embodiment.

FIG. 1 is a perspective view illustrating a MEMS device according to a first embodiment. As depicted in FIG. 1, a MEMS device 100 includes a substrate 200, a mirror 300, an actuator 400, and an actuator 500. The MEMS device 100 is an optical switch that changes the angle of the mirror 300 a small amount and switches paths of light reflected at the mirror 300.

The mirror 300 is rotatable about the x-axis and the y-axis. The actuator 400 rotates the mirror 300 about x-axis. The actuator 400 includes a fixed electrode 410, a movable electrode 420, and a voltage applying unit 430. The fixed electrode 410 is fixed to the substrate 200.

The movable electrode 420 is rotatable about an axis 201 of the substrate 200. The movable electrode 420 rotates about the axis 201 and changes a relative position with respect to the fixed electrode 410. The mirror 300 is fixed to the movable electrode 420. The voltage applying unit 430 applies voltage to the fixed electrode 410 and the movable electrode 420. A voltage control unit (not depicted) is connected to the voltage applying unit 430 and controls the voltage applied to the fixed electrode 410 and the movable electrode 420 by the voltage applying unit 430.

The voltage control unit controls the applied voltage, for example, at tens to hundreds of volts. In this way, the voltage applied to the fixed electrode 410 and the movable electrode 420 causes electrostatic attractive force between the fixed electrode 410 and the movable electrode 420 and rotates the movable electrode 420 about the axis 201. As the movable electrode 420 rotates, the mirror 300 fixed to the movable electrode 420 also rotates about the axis 201.

As a result, the angle at which the mirror 300 reflects light changes. When voltage applied to the fixed electrode 410 and the movable electrode 420 is changed, the degree of rotation of the movable electrode 420 changes; whereby the angle at which the mirror 300 reflects light can be controlled. When voltage applied to the fixed electrode 410 and the movable electrode 420 is changed, optical paths can be switched.

The actuator 500 rotates the mirror 300 about y-axis. The structure of the actuator 500 is similar to that of the actuator 400 and thus the explanation thereof is omitted. The actuator 400 rotates the mirror 300 about the x-axis and the actuator 500 rotates the mirror 300 about the y-axis; whereby the angle at which the mirror 300 reflects light can be changed two-dimensionally.

Figure 2:
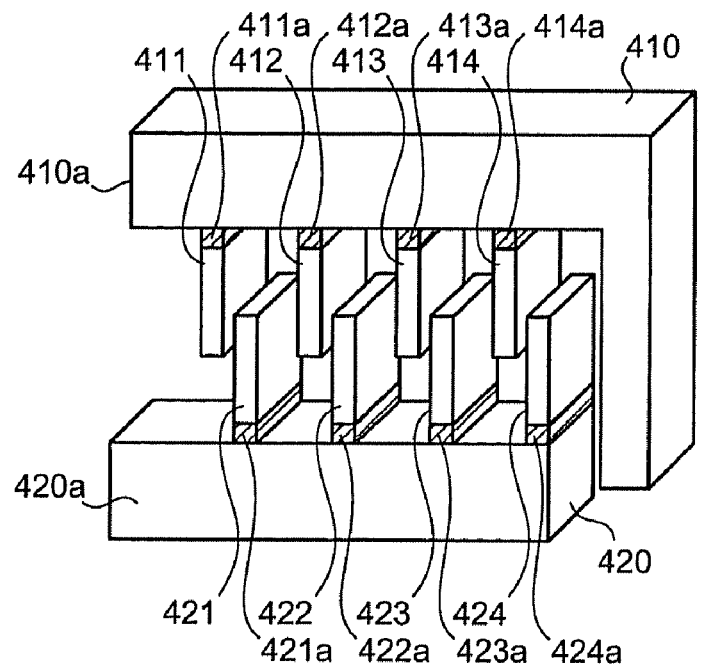
FIG. 2 is a perspective view of electrodes of the MEMS device according to the first embodiment.

FIG. 2 is a perspective view of electrodes of the MEMS device according to the first embodiment. In FIG. 2, parts identical to those depicted in FIG.1 are indicated by the same reference numerals used in FIG. 1 and explanations therefor are omitted. As depicted in FIG. 2, the fixed electrode 410 includes a fixed electrode unit 410a that is fixed to the substrate 200 and to which voltage is applied, and multiple electrodes 411-414 (first electrode group) that are arranged in a comb-like configuration on the fixed electrode 410a.

The movable electrode 420 includes a movable electrode unit 420a to which voltage is applied, and multiple electrodes 421-424 (second electrode group) that are formed on the movable electrode unit 420a. The electrodes 421-424 of the movable electrode 420 face the electrodes 411-414 of the fixed electrode 410 and are arranged in a comb-like configuration.

In this explanation, the electrodes 411-414 and the electrodes 421-424 take a comb-like configuration where flat plates are arranged at regular intervals. There is sufficient space between the electrodes 411-414 and the electrodes 421-424 for the movable electrode 420 to move with respect to the fixed electrode 410 when voltage is applied to the fixed electrode 410 and the movable electrode 420.

At the base of each electrode 411-414 of the fixed electrode 410, a resistor 411a-414a is disposed. The base of the respective electrodes 411-414 indicates an end part of the respective electrodes 411-414 with respect to the fixed electrode 410, or a part near the end part. At the base of each electrode 421-424 of the movable electrode 420, a resistor 421a-424a is disposed. For each of the resistors 411a-414a and the resistors 421a-424a, a resistor of 10 kΩ may be used.

In this way, the electrodes 411-414 of the fixed electrode 410 are connected via the resistors 411a-414a so that the respective, electrodes 411-414 are electrically isolated. The electrodes 421-424 of the movable electrode 420 are also connected via the resistors 421a-424a so that the respective electrodes 421-424 are electrically isolated.

Figure 3:
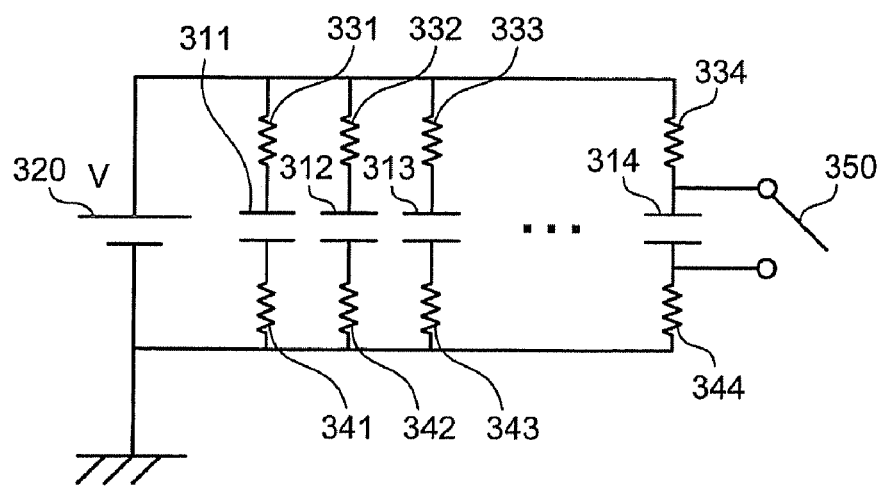
FIG. 3 is a circuit diagram equivalent to the MEMS device depicted in FIG. 2.

FIG. 3 is a circuit diagram equivalent to the MEMS device depicted in FIG. 2. As depicted in FIG. 3, the electrodes 411-414 and the electrodes 421-424 facing the electrodes 411-414 are equivalent to multiple condensers 311-314 connected in parallel.

Since the condensers 311-314 are electrically isolated by resistors 331-334 and resistors 341-344, the condensers 311-314 are multiple independent condensers and cannot be considered as one large condenser. When the electrodes 411-414 and the electrodes 421-424 are taken as the condensers 311-314, the shape and position of the respective electrodes 411-414 and 421-424 are designed so that capacity of the respective condensers 311-314 becomes 1.4 pF.

The voltage applying unit 430 that applies voltage to the fixed electrode 410 and the movable electrode 420 is equivalent to a power source 320. The resistors 411a-414a at the bases of the electrodes 411-414 are equivalent to the resistors 331-334 at the ends of the condensers 311-314. The resistors 421a-424a are equivalent to the resistors 341-344 at the ends of the condensers 341-344.

The spark discharge is equivalent to a state where a switch 350 connecting both ends of one of the condensers 311-314 (in this explanation, the condenser 314) is instantaneously turned on. After the switch 350 is instantaneously turned on, charges on the condenser 314 disappear through the switch 350.

The condensers 311-313 to which the switch 350 is not connected are electrically isolated from the condenser 314 by the resistors 331-334 and the resistors 341-344. Thus, charges on the condensers 311-313 remain even after the switch 350 is instantaneously turned on.

Figures 4, 5:
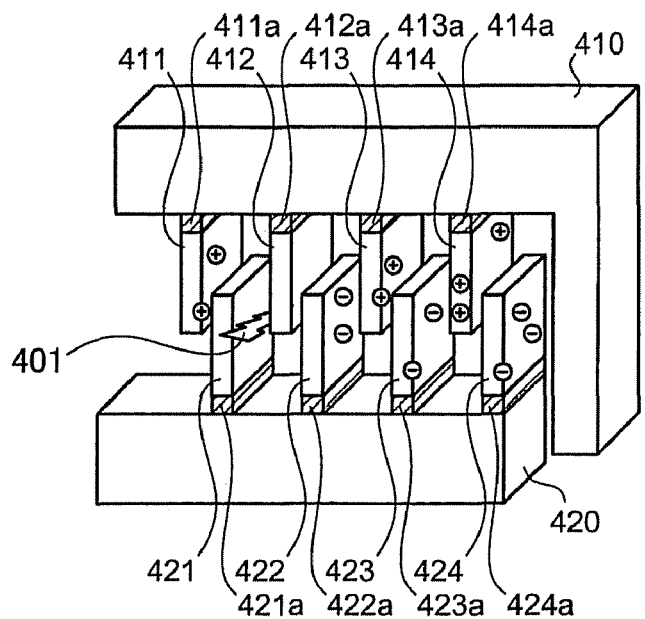
FIG. 4 is a perspective view of the MEMS device illustrating operation of the MEMS device according to the first embodiment.
FIG. 5 is a table illustrating an effect of the MEMS device according to the first embodiment.

FIG. 4 is a perspective view of the MEMS device illustrating operation of the MEMS device according to the first embodiment. As depicted in FIG. 4, positive charges gather on the fixed electrode 410 and negative charges gather on the movable electrode 420 to create electrostatic attractive force. When the spark discharge occurs between the electrode 412 and the electrode 421, as expressed by reference numeral 401, charges on the electrodes 412 and 421 disappear.

The electrode 412 is electrically isolated from the electrodes 411, 413, and 414 by the resistor 412a. Therefore, flow of charges from the electrodes 411, 413, and 414 to the electrode 412 is suppressed. The electrode 421 is also electrically isolated from the electrodes 422-424 by the resistor 421a. Thus, flow of charges from the electrodes 422-424 to the electrode 421 is suppressed.

In this way, electrodes that lose charges are limited to the electrodes 412 and 421 between which the spark discharge occurred; whereby decrease of electrostatic attractive force between the fixed electrode 410 and the movable electrode 420 is suppressed. For instance, when the fixed electrode 410 and the movable electrode 420 each has 20 electrodes arranged in a comb-like configuration, even if spark discharge occurs between one pair of electrodes, the electrostatic attractive force is maintained between the other 19 pairs of electrodes. Therefore, decrease in the electrostatic attractive force between the fixed electrode 410 and the movable electrode 420 is reduced to one twentieth.

Since electrical current due to the spark discharge is converted to voltage at the resistors 412a and 421a, potential of the electrodes 412 and 421 fluctuates with small electrical current. Thus, large electrical current flows at the spark discharge, and the potential difference between the electrodes 412 and 421 changes instantaneously. As a result, a period of the spark discharge shortens and the current due to the spark discharge decreases.

FIG. 5 is a table illustrating an effect of the MEMS device according to the first embodiment. In the table of FIG. 5, the first column depicts a resistance [Ω] of the resistors 411a-414a and 421a-424a of the fixed electrode 410 and the movable electrode 420. The second column depicts a voltage drop [%] between the fixed electrode 410 and the movable electrode 420 when the spark discharge occurs between the fixed electrode 410 and the movable electrode 420.

The third column depicts a variation [°] of a rotation angle of the mirror 300 immediately after the spark discharge due to the spark discharge and the voltage drop between the fixed electrode 410 and the movable electrode 420. The fourth column depicts a RC time constant [sec] of the equivalent circuit depicted in FIG. 3.

As depicted in the second row of the table, the voltage drop of the conventional MEM device without the resistors 411a-414a and 421a-424a (the resistance is set to 1Ω) is 100% and the comparison is made with cases below. The variation of the rotation angle of the mirror 300 is 2.55°. The RC time constant is 0.1 psec.

As depicted in the third row of the table, when the resistance of the resistors 411a-414a and 421a-424a is set to 1 kΩ, even if the spark discharge occurs between a pair of the electrodes 411-414 and 421-424, the voltage drop is 45.3%. The variation of the rotation angle of the mirror 300 is 1.04°. The RC time constant of the equivalent circuit is 100 psec.

As depicted in the fourth row of the table, when the resistance of the resistors 411a-414a and 421a-424a is set to 10 kΩ, even if the spark discharge occurs between a pair of the electrodes 411-414 and 421-424, the voltage drop is 7.7%. The variation of the rotation angle of the mirror 300 is 0.19°. The RC time constant of the equivalent circuit is 1 nsec.

As explained, resistors of high resistance are disposed at the bases of the electrodes 411-414 and 421-424 so that variation of the rotation angle of the mirror 300 at the spark discharge can be greatly reduced. In particular, by the insertion of the resistors 411a-414a and 421a-424a of 10 kΩ at the bases of the electrodes 411-414 and 421-424, the variation of the rotation angle of the mirror 300 is reduced to the extent that a communications system is not affected. The resistors 411a-414a and 421a-424a may have a resistance in the range of 1 kΩ to 20 kΩ with consideration of manufacturing limitations.

The resistors 411a-414a and 421a-424a at the bases of the electrodes 411-414 and 421-424 forms a RC filter in the equivalent circuit (see FIG. 3). The RC time constant of the RC filter increases up to about 1 nsec. However, since the rotation of the mirror 300 is a mechanical movement, variation of the rotation angle of the mirror 300 is sufficiently slow compared with the RC time constant.

Specifically, a response speed of the rotation of the movable electrode 420 and the mirror 300 is about 1 msec, calculated from resonance frequency. This response speed is about one million times slower than the RC filter's RC time constant of 1 nsec. Thus, the RC time constant of this equivalent circuit is absorbed in the response speed of the movable electrode 420 and the mirror 300 and can be ignored.

Figure 6:
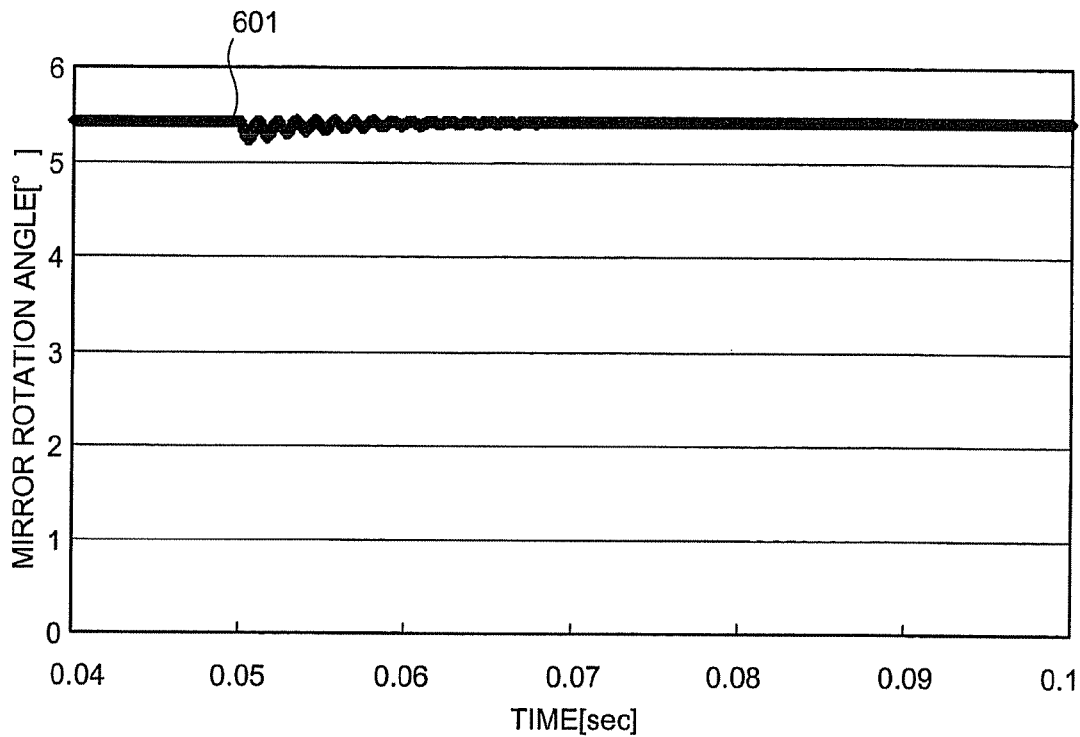
FIG. 6 is a graph depicting displacement due to spark discharge in the MEMS device according to the first embodiment.

FIG. 6 is a graph depicting displacement due to spark discharge in the MEMS device according to the first embodiment. The horizontal axis of FIG. 6 is time [sec]. The vertical axis is the rotation angle [°] of the mirror 300 of the MEMS device 100. Reference numeral 601 indicates the time at which the spark discharge occurred. As indicated in FIG. 6, the variation of the rotation angle of the mirror 300 at the time when the spark discharge occurs is greatly reduced compared with the conventional MEMS device (see FIG. 19). In addition, the recovery time from the occurrence of the spark discharge to convergence to the original angle of the mirror 300 shortens.

Figure 7:
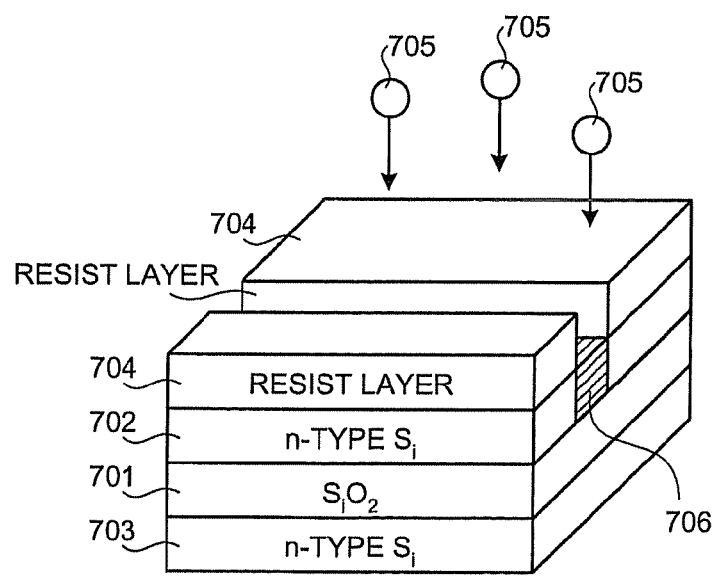
FIG. 7 is a perspective view of one example of fabrication of a resistor of the MEMS device according to the first embodiment.

FIG. 7 is a perspective view of one example of fabrication of a resistor of the MEMS device according to the first embodiment. Often a semiconductor of a single crystal has high resistivity and thus impurities are purposely introduced. Electrons or holes are donated by the doped impurity ions due to the thermal energy of the base material and the donated electrons or holes act as carriers. The resistivity of a region into which impurities are introduced lowers in proportion to the amount of impurities and thus electrical current flows more easily.

On the other hand, when impurities whose ion valence is opposite the ion valence of the base material are introduced to the base material, the resistivity of the region in which the impurities are introduced increases. For instance, when trivalent ions have been added to tetravalent silicon and pentavalent ions are further added to the silicon, holes originating from the trivalent ions and electrons originating from the pentavalent ions are recombined; whereby carriers at the conduction band and the valence band decreases.

In this case, the resistivity of the region into which pentavalent ions are added can be increased. When the number of trivalent ions is equal to the number of tetravalent ions, the resistivity increases up to a value nearly equal to the resistivity of an intrinsic semiconductor, into which no impurity has been introduced. Ions for increasing the resistivity of the base station are called compensation ions.

Here, as depicted in FIG. 7, n-type $S_i$ 702 and n-type $S_i$ 703 are formed to sandwich $S_iO_2$ 701, and the patterning of a resist layer 704 is performed on a surface of the n-type $S_i$ 702. The compensation ions 705 are introduced from above the resist layer 704, and the resistivity of a region 706 that is not covered by the resist layer 704 is increased. A resist layer may be formed on the n-type $S_i$ 703 and the compensation ions 705 may be introduced (not depicted in FIG. 7); whereby the resistivity of part of the n-type $S_i$ 703 is increased.

After the $S_iO_2$ 701 and the resist layer 704 are removed from the n-type $S_i$ 702 and the n-type $S_i$ 703, the n-type $S_i$ 702 and the n-type $S_i$ 703 with resistivity increased in part are obtained. Cutting of the n-type $S_i$ 702 and the n-type $S_i$ 703 makes the comb-like fixed electrode 410 and movable electrode 420 or various electrodes which will be described later. When the compensation ions 705 are accelerated in the electric field, the compensation ions 705 can be introduced not only to a surface of but also deeper into the n-type $S_i$ 702 and the n-type $S_i$ 703.

Figure 8:
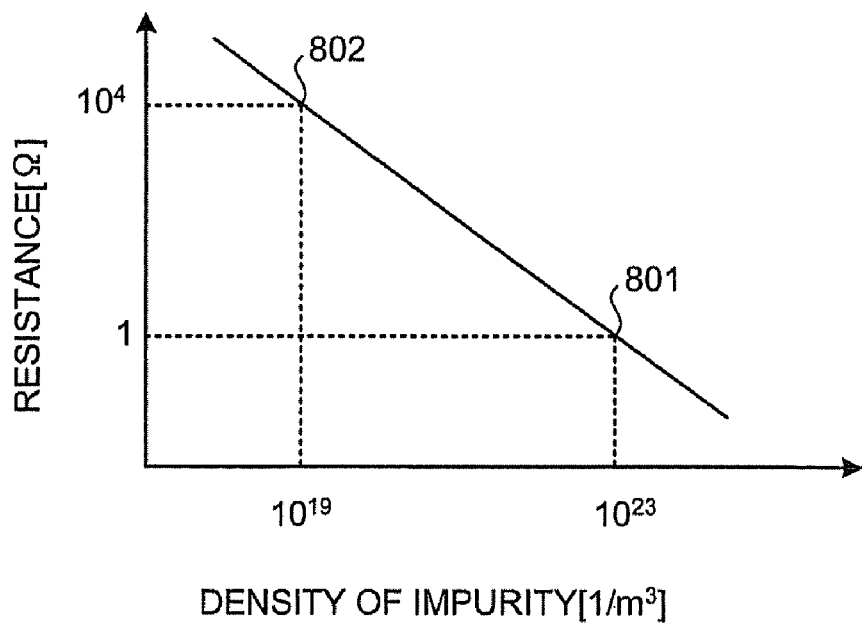
FIG. 8 is a graph illustrating a relationship between impurity density and resistance.

FIG. 8 is a graph illustrating a relationship between impurity density and resistance. In FIG. 8, the horizontal axis is the density of an impurity [1/m3] that is introduced into a to-be-a-resistor part of the fixed electrode 410 and the movable electrode 420. The vertical axis is the resistance [Ω] formed in the fixed electrode 410 and the movable electrode 420. As indicated by reference numeral 801, in general, the density of impurity is about 1023/m3 and the resistance is about 1Ω.

On the other hand, according to the MEMS device 100 of the first embodiment, as indicated by reference numeral 802, a resistor of about 10 kΩ can be formed after the compensation ions 705 are introduced into the to-be-a-resistor part 706 and the density of impurity is reduced to about 1019/m3. Here, one example of a process of forming a resistor has been introduced but the process is not limited to this example, and various methods may be used.

Figure 9:
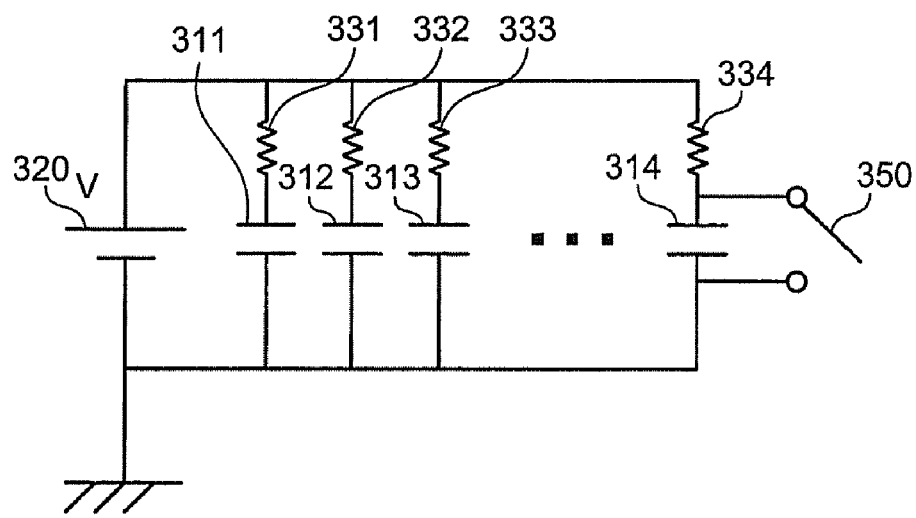
FIG. 9 is a circuit diagram equivalent to an example where electrodes of the MEMS device according to the first embodiment are modified.

FIG. 9 is a circuit diagram equivalent to an example where electrodes of the MEMS device according to the first embodiment are modified. In FIG. 9, parts identical to those depicted in FIG. 3 are indicated by the same reference numerals used in FIG. 3 and explanations therefor are omitted. In the first embodiment above, the fixed electrode 410 and the movable electrode 420 include the resistors 411a-414a and the resistors 421a-424a respectively but only one of the fixed electrode 410 and the movable electrode 420 may have such resistors.

Figure 10:
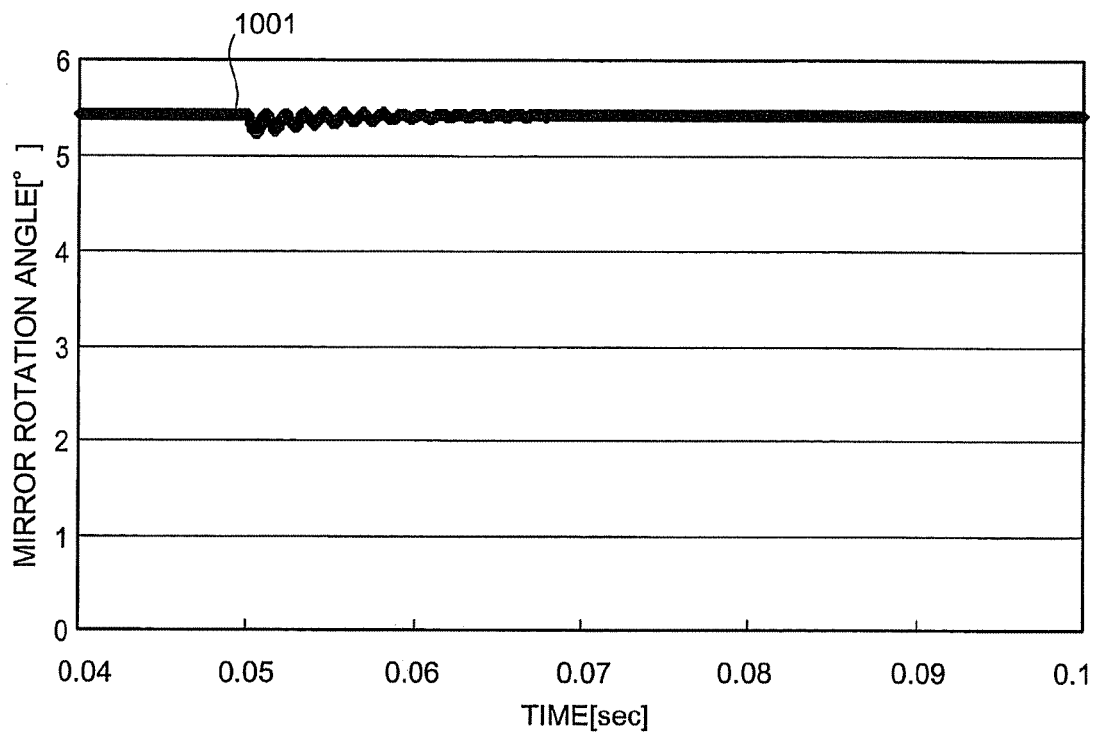
FIG. 10 is a graph depicting the displacement of a mirror of the MEMS device due to spark discharge.

FIG. 10 is a graph depicting the displacement of a mirror of the MEMS device due to spark discharge. With respect to FIG. 10, only the electrodes 411-414 of the fixed electrode 410 include resistors of 20 kΩ respectively. Reference numeral 1001 indicates the point of time at which the spark discharge has occurred. As indicated by reference numeral 1001, the variation of the rotation angle of the mirror 300 at the spark discharge is greatly reduced compared with the conventional MEMS device (see FIG. 19).

As explained, even if only one among the fixed electrode 410 and the movable electrode 420 includes resistors, an effect of the embodiments can be obtained. Further, when resistors are used of a larger resistance compared with the resistors used when included in both the fixed electrode 410 and the movable electrode 420, an advantage can be obtained in a similar manner to a case where the resistors are included in both the fixed electrode 410 and the movable electrode 420.

Though the resistance of the resistors 411a-414a and 421a-424a is about 10 kΩ or 20 kΩ in the above explanation, resistance of the resistors is determined based on the shape of the fixed electrode 410 and the movable electrode 420, and on the voltage applied to the fixed electrode 410 and the movable electrode 420 by the voltage applying unit 430 (this is also the case in the subsequent embodiments).

The larger voltage applied to the fixed electrode 410 and the movable electrode 420 by the voltage applying unit 430 is, the higher the resistance of the resistors is set. The shape of the electrode indicates an interval between electrodes 411-414 and an interval between electrodes 421-424, an interval between opposing electrodes 411-414 and 421-424, the electrode area opposing another electrode, and so on.

The resistance of the resistors is set such that the movement of charges between the electrodes 411-414 and the electrodes 421-424 is suppressed. In this way, electrodes that lose charges are limited to those at which a spark discharge has occurred and the decrease of the electrostatic attractive force between the fixed electrode 410 and the movable electrode 420 is prevented.

Figure 11:
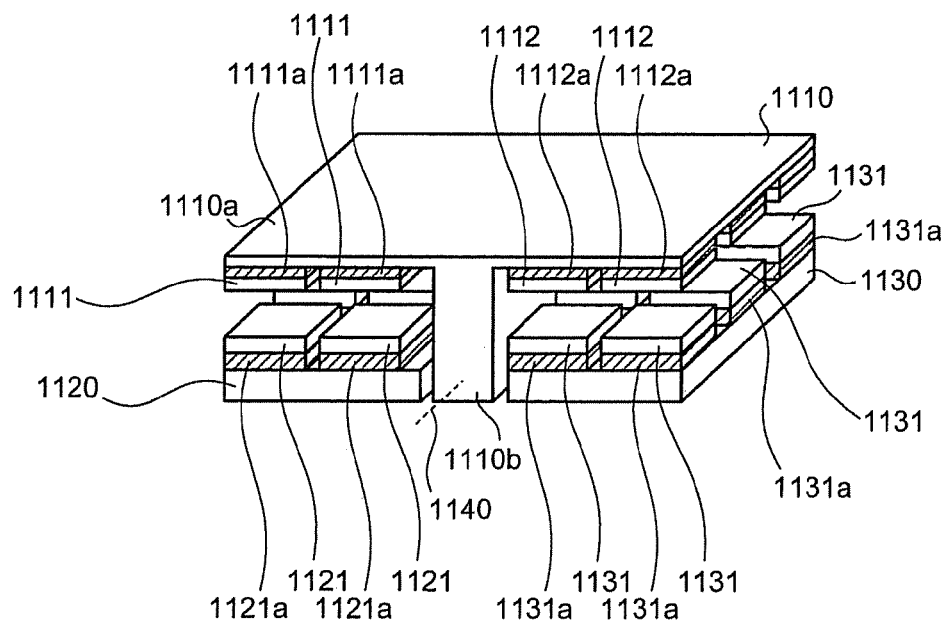
FIG. 11 is a perspective view of electrodes of a MEMS device according to a second embodiment.

FIG. 11 is a perspective view of electrodes of a MEMS device according to a second embodiment. According to the MEMS device 100 of the first embodiment, the electrodes 411-414 and the electrodes 421-424 are formed in a comb-like configuration on the fixed electrode 410 and the movable electrode 420; however, configuration of the fixed electrode 410 and the movable electrode 420 is not limited to the first embodiment; namely, multiple electrodes may be arranged in array-like configuration on the fixed electrode 410 and the movable electrode 420.

A MEMS device 100 according to the second embodiment includes, for example, as depicted in FIG. 11, a movable electrode 1110, a fixed electrode 1120, and a fixed electrode 1130. The movable electrode 1110 is rotatable about an axis 1140. The movable electrode 1110 includes a flat plate unit 1110a and a flat plate unit 1110b.

The flat plate unit 1110b is placed on a back side and at a central part of the flat plate unit 1110a, the flat plate unit 1110b being perpendicular to the flat plate unit 1110a. Therefore, a vertical sectional view of the movable electrode 1110 has a T-shape. On a surface of the flat plate unit 1110a, a mirror (not depicted) is fixed. In two spaces separated by the flat plate unit 1110b, multiple parallel electrodes 1111 (second electrode group) and multiple parallel electrodes 1112 (second electrode group) are disposed.

On the fixed electrode 1120, multiple parallel electrodes 1121 (first electrode group) opposing the parallel electrodes 1111 on the movable electrode 1110 are disposed. On the fixed electrode 1130, multiple parallel electrodes 1131 (first electrode group) opposing the parallel electrodes 1112 on the movable electrode 1110 are disposed.

When voltage is applied to the movable electrode 1110 and the fixed electrodes 1120 and 1130, electrostatic attractive force arises between the movable electrode 1110 and the fixed electrodes 1120 and 1130. According to the voltage applied, the parallel electrodes 1111 are attracted to the parallel electrodes 1121 or the parallel electrodes 1112 are attracted to the parallel electrodes 1131.

In this way, the movable electrode 1110 rotates about the axis 1140. As the movable electrode 1110 rotates, the mirror fixed on the movable electrode 1110 also rotates about the axis 1140; whereby an angle at which the mirror reflects light changes. Controlling the voltage applied to the movable electrode 1110 and the fixed electrodes 1120 and 1130 changes the degree of rotation and the direction of rotation of the movable electrode 1110; whereby an angle at which the mirror reflects light can be adjusted.

At the base of each parallel electrode 1111, a resistor 1111a is disposed. At the base of each parallel electrode 1112, a resistor 1112a is disposed. At the base of each parallel electrode 1121, a resistor 1121a is disposed. At the base of each parallel electrodes 1131, a resistor 1131a is disposed.

In this way, the parallel electrodes 1111 are connected to each other via the resistors 1111a and are electrically isolated. The parallel electrodes 1112 are connected to each other via the resistors 1112a and are electrically isolated.

The parallel electrodes 1121 are connected to each other via the resistors 1121a and are electrically isolated. The parallel electrodes 1131 are connected to each other via the resistors 1131a and are electrically isolated. An equivalent electric circuit for this example is similar to the equivalent circuit depicted in FIG. 3.

As a result, even if spark discharge occurs between a pair of electrodes 1111, 1112, 1121, and 1131, electrodes that lose charges are limited to the pair of electrodes between which the spark discharge has occurred; whereby the electrostatic attractive force between the other parallel electrodes is not lowered. Thus, the variation of the rotation angle of the mirror fixed on the movable electrode 1110 at the spark discharge can be reduced.

Further, in this structure, an aspect ratio of each of resistors 1111a, 1112a, 1121a, 1131a to the movable electrode 1110, the fixed electrode 1120, the fixed electrode 1130 is small. Thus, processes for forming the resistors 1111a, 1112a, 1121a, 1131a on the movable electrode 1110, the fixed electrode 1120 and the fixed electrode 1130 are facilitated.

Figure 12:
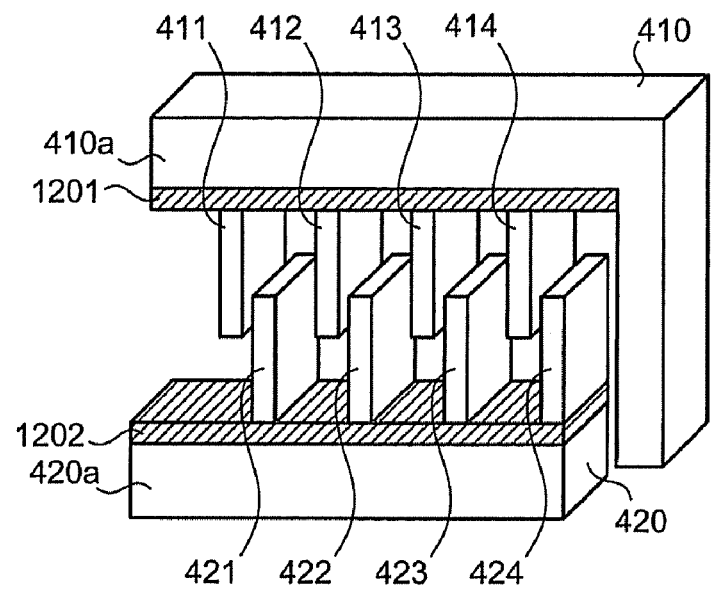
FIG. 12 is a perspective view of electrodes of a MEMS device according to a third embodiment.
Figure 13:
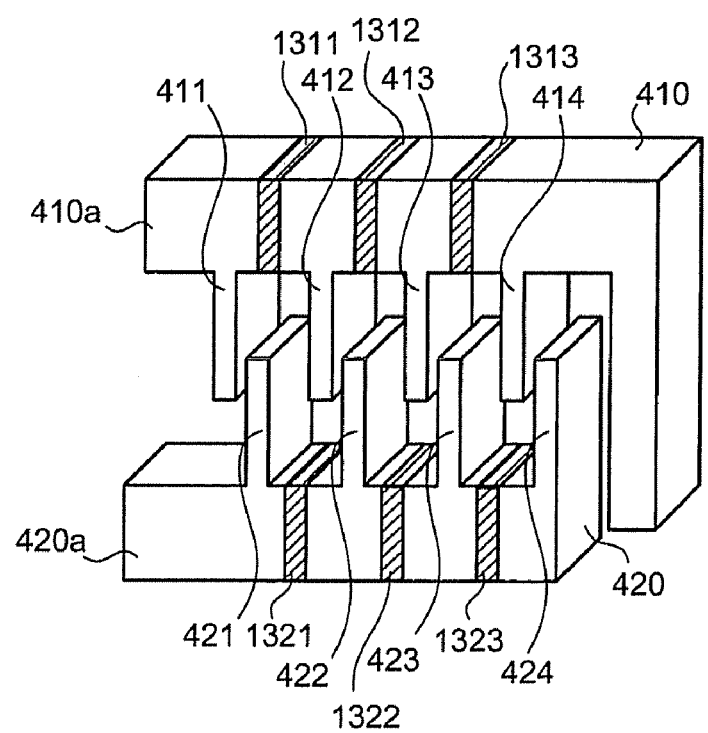
FIG. 13 is a perspective view of an example of modification of the electrodes of the MEMS device according to the third embodiment.

FIG. 12 is a perspective view of electrodes of a MEMS device according to a third embodiment. FIG. 13 is a perspective view of an example of modification of the electrodes of the MEMS device according to the third embodiment. In FIGS. 12 and 13, parts identical to those depicted in FIG. 2 are indicated by the same reference numerals used in FIG. 2 and explanations therefor are omitted.

In the explanation of the MEMS device 100 according to the first and second embodiments, a resistor (for example resistors 411a-414a) is disposed at the base of each electrode (for example electrodes 411-414) of the fixed electrode 410 and the movable electrode 420; however, disposition of the resistor is not limited to the embodiments, i.e., it suffices that electrodes are connected to each other via a resistor and are electrically isolated.

For instance, as depicted in FIG. 12, multiple electrodes may be electrically isolated by one resistor. Specifically, at the fixed electrode 410, a resistor 1201 may be formed on a fixed electrode unit 410a on which the electrodes 411-414 are provided. As a result, the electrodes 411-414 are connected to each other via the resistor 1201 and are electrically isolated.

At the movable electrode 420, a resistor 1202 may be formed on the movable electrode unit 420a on which the electrodes 421-424 are provided. As a result, the electrodes 421-424 are connected to each other via the resistor 1202 and are electrically isolated. An equivalent electric circuit in this case is similar to the equivalent circuit depicted in FIG. 3.

Further, as depicted in FIG. 13, for example, resistors 1311-1313 may be disposed in the fixed electrode unit 410a such that the resistors 1311-1313 separate the electrodes 411-414. As a result, the electrodes 411-414 are connected to each other via the resistors 1311-1313 and are electrically isolated.

Resistors 1321-1323 may be provided in the movable electrode unit 420a such that the resistors 1321-1323 separate the electrodes 421-424. As a result, the electrodes 421-424 are connected to each other via the resistors 1321-1323 and are electrically isolated. An equivalent electric circuit in this case is similar to the equivalent circuit depicted in FIG. 3.

The MEMS device 100 and the modified MEMS device 100 according to the third embodiment may be applied to the MEMS device 100 of the first or second embodiment (see FIGS. 2, 9, 11).

Figure 14:
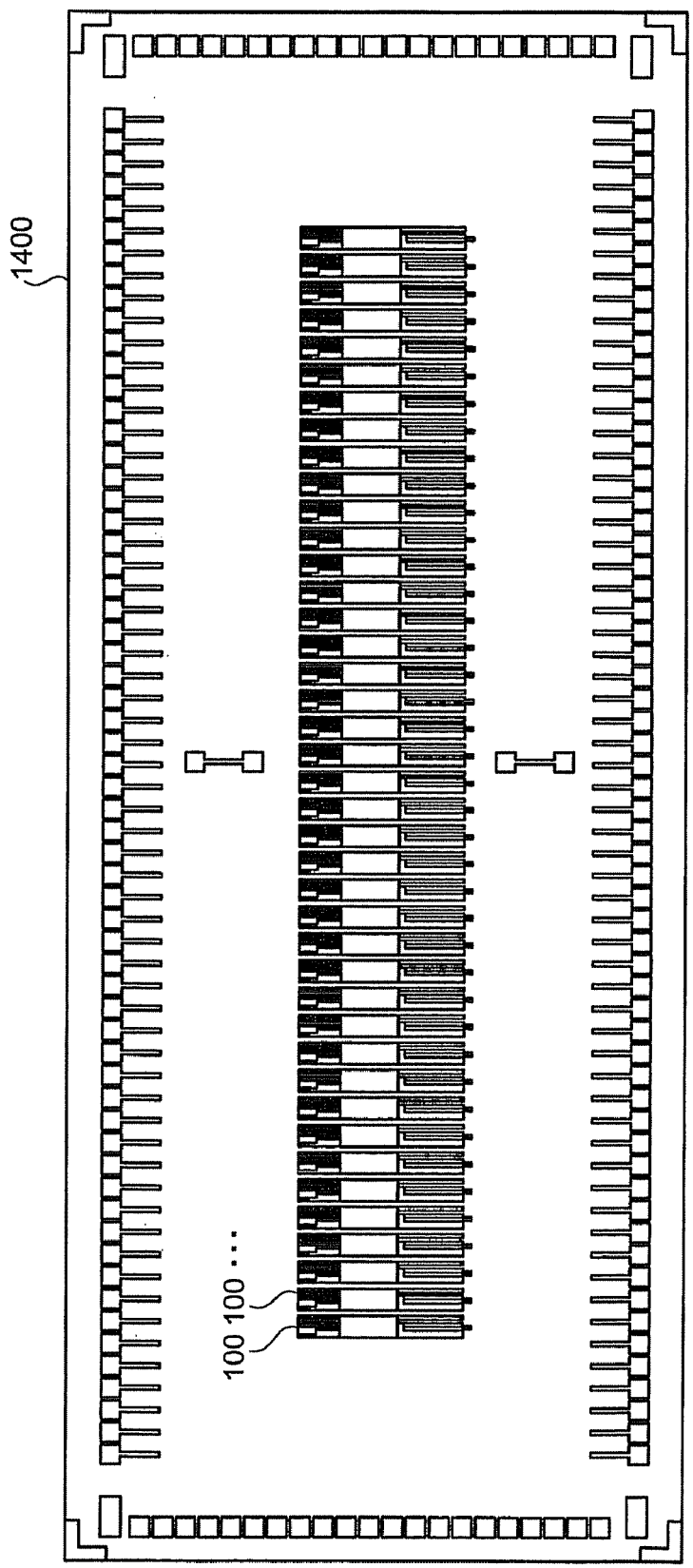
FIG. 14 is a plan view of an optical switch according to a fourth embodiment.
Figure 15:
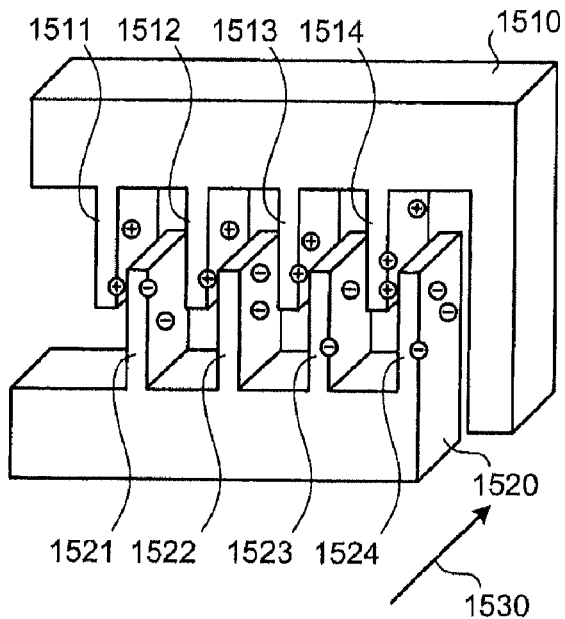
FIG. 15 is a perspective view of electrodes of a conventional MEMS device.
Figure 16:
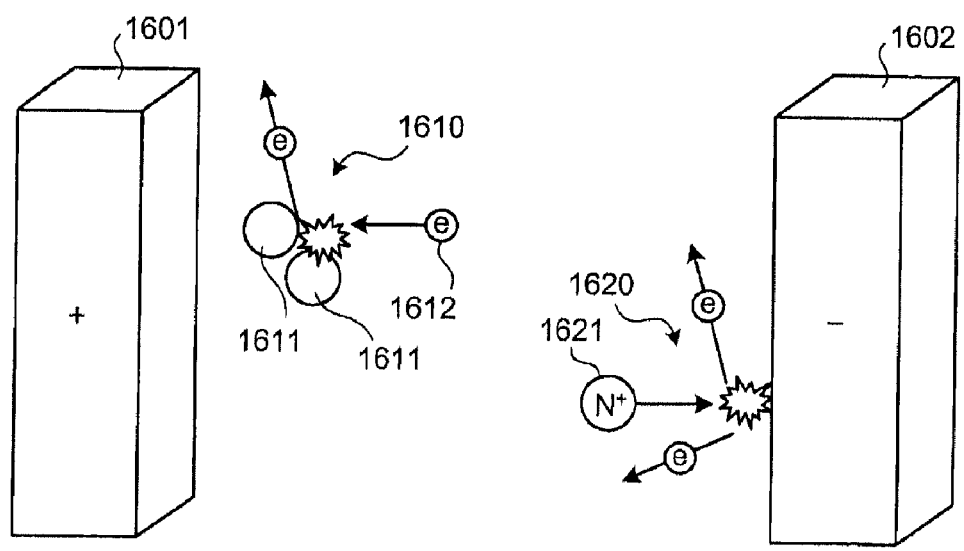
FIG. 16 is an explanatory diagram for the principle of spark discharge.
Figure 17:
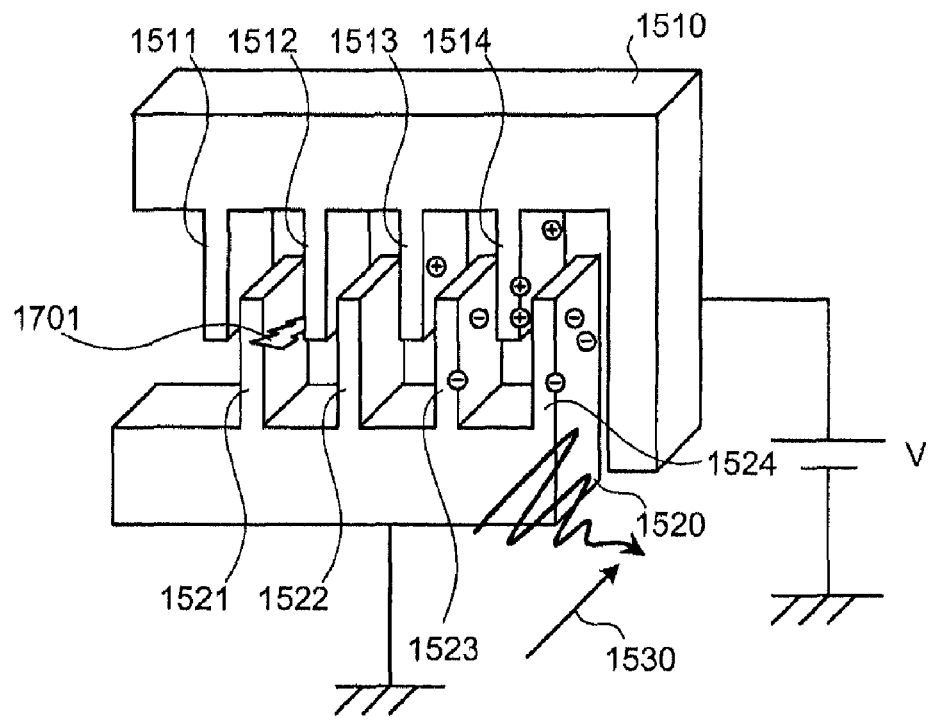
FIG. 17 is an explanatory diagram illustrating spark discharge occurring in the conventional MEMS device.
Figure 18:
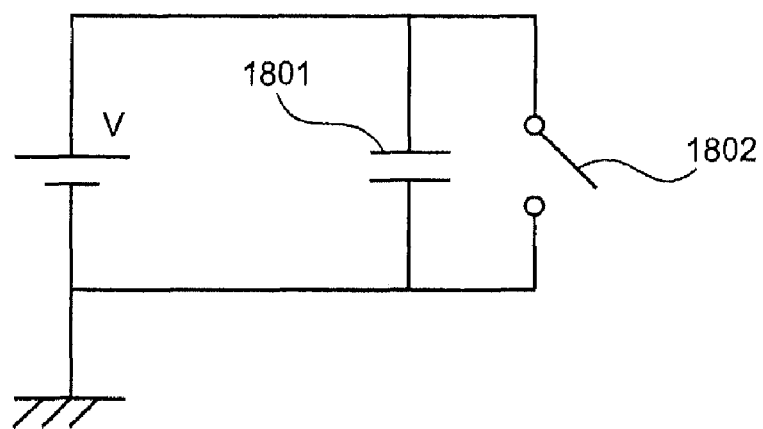
FIG. 18 is a circuit diagram that is equivalent to the MEMS device depicted in FIG. 17.

FIG. 14 is a plan view of an optical switch according to a fourth embodiment. As depicted in FIG. 14, the MEMS devices 100 of the above embodiments are arranged on a circuit board 1400 to form a packaged optical switch. The MEMS devices 100 are connected to the circuit board 1400 by wire bonding.

The circuit board 1400 includes a voltage control unit (not depicted) that controls the voltage to be applied to the fixed electrode 410 and the movable electrode 420 by the voltage applying unit 430. The voltage control unit controls the voltage applied to each of the MEMS devices 100 arranged on the circuit board 1400 and adjusts the angle at which the mirrors 300 of the MEMS devices reflect light.

As explained, according to a MEMS device and an optical switch of the embodiments, the reduction of electrostatic attractive force between a fixed electrode and a movable electrode upon spark discharge can be prevented. Therefore, according to a MEMS device and an optical switch of the embodiments, unexpected variation of the movable electrode upon spark discharge is suppressed; whereby stable behavior of the MEMS device and the optical switch can be achieved. Further, the time period that the spark discharge persists is shortened and the recovery time of the movable electrode to return to an original position is also shortened.

In the explanation of the embodiments above, a MEMS device is applied to an optical switch; however, application of the MEMS device according to the embodiments is not limited to an optical switch.

According to the embodiments, even if spark discharge occurs, unexpected variation of a movable electrode can be prevented. In addition, the entire surface of an electrode may be covered with an insulating film. In this way, the spark discharge is curbed and unexpected variation of the movable electrode is suppressed. As a result, a MEMS device such as an optical switch can operate more stably.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A micro electro mechanical system device comprising: a fixed electrode that includes a first electrode group; and a movable electrode that moves with respect to the fixed electrode as voltage is applied and includes a second electrode group that opposes the first electrode group, wherein
electrodes of at least one among the first electrode group and the second electrode group are connected via a resistor.

2. The micro electro mechanical system device according to claim 1, wherein the electrodes of the first electrode group and the electrodes of the second electrode group are arranged in a comb-like configuration, and are alternately positioned.

3. The micro electro mechanical system device according to claim 2, wherein the resistor is provided at a base of each of the electrodes of at least one among the first electrode group and the second electrode group.

4. The micro electro mechanical system device according to claim 1, wherein the electrodes of the first electrode group and the electrodes of the second electrode group are parallel electrodes.

5. The micro electro mechanical system device according to claim 4, wherein the resistor is provided at a base of each of the parallel electrodes of at least one among the first electrode group and the second electrode group.

6. The micro electro mechanical system device according to claim 1, wherein
the fixed electrode includes:
a first electrode unit to which voltage is applied and on which the first electrode group arranged in array-like form is disposed,
the movable electrode includes:
a second electrode unit to which voltage is applied and on which the second electrode group arranged in array-like form is disposed, and
the resistor is disposed on at least one among the first electrode unit and the second electrode unit.

7. The micro electro mechanical system device according to claim 1, wherein
the fixed electrode includes:
a first electrode unit to which voltage is applied and on which the first electrode group arranged in array-like form is disposed,
the movable electrode includes:
a second electrode unit to which voltage is applied and on which the second electrode group arranged in array-like form is disposed, and
the resistor is disposed on at least one among the first electrode unit and the second electrode unit, separating the electrodes thereof.

8. The micro electro mechanical system device according to claim 1, wherein
resistance of the resistor is determined based on capacitance between the first electrode group and the second electrode group and on the applied voltage.

9. The micro electro mechanical system device according to claim 1, further comprising insulating film that covers a surface of the first electrode group and the second electrode group.

10. The micro electro mechanical system device according to claim 1, further comprising a voltage applying unit that applies voltage to the fixed electrode and the movable electrode to displace the movable electrode a desired amount with respect to the fixed electrode.

11. The micro electro mechanical system device according to claim 1, wherein
at least one among the fixed electrode and the second electrode is provided with ions of a valence opposite to a valence of semiconductor forming the fixed electrode and the movable electrode.

12. An optical switch comprising:
a micro electro mechanical system device including:
a fixed electrode that includes a first electrode group, and
a movable electrode that moves with respect to the fixed electrode as voltage is applied and includes a second electrode group that opposes the first electrode group, wherein
electrodes of at least one among the first electrode group and the second electrode group are connected via a resistor; and
a mirror that is fixed on the movable electrode and changes an angle at which light is reflected as the movable electrode moves.

13. An optical switch comprising a plurality of optical switches arranged in array-like form and including:
a micro electro mechanical system device including:
a fixed electrode that includes a first electrode group, and
a movable electrode that moves with respect to the fixed electrode as voltage is applied and includes a second electrode group that opposes the first electrode group, wherein
electrodes of at least one among the first electrode group and the second electrode group are connected via a resistor; and
a mirror that is fixed on the movable electrode and changes an angle at which light is reflected as the movable electrode moves.

* * * * *